United States Patent
Ishizawa (10) Patent No.: US 10,490,392 B2
(45) Date of Patent: Nov. 26, 2019

(54) FOCUS RING REPLACEMENT METHOD AND PLASMA PROCESSING SYSTEM

(71) Applicant: Tokyo Electron Limited, Tokyo (JP)

(72) Inventor: Shigeru Ishizawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/642,517

(22) Filed: Jul. 6, 2017

(65) Prior Publication Data
US 2018/0019107 A1    Jan. 18, 2018

(30) Foreign Application Priority Data
Jul. 14, 2016    (JP) .................................. 2016-139681

(51) Int. Cl.
  *H01J 37/32*      (2006.01)
  *B08B 7/00*       (2006.01)
(52) U.S. Cl.
  CPC ...... *H01J 37/32807* (2013.01); *B08B 7/0035* (2013.01); *H01J 37/32642* (2013.01); *H01J 37/32862* (2013.01)
(58) Field of Classification Search
  CPC .......... H01J 37/32642; H01J 37/32715; H01J 37/3288; H01J 37/32862; H01L 21/67742; B08B 7/0035
  See application file for complete search history.

(56) References Cited

U.S. PATENT DOCUMENTS

| | | | |
|---|---|---|---|
| 5,423,918 A * | 6/1995 | Gupta | C23C 16/4401 134/1 |
| 2005/0082000 A1 | 4/2005 | Moriya et al. | |
| 2005/0099135 A1* | 5/2005 | Landis | H01J 37/32642 315/111.41 |
| 2006/0110836 A1* | 5/2006 | Devany | H01L 21/67265 438/5 |
| 2011/0031111 A1* | 2/2011 | Kobayashi | H01J 37/32623 204/192.34 |
| 2012/0046904 A1 | 2/2012 | Hayashi et al. | |
| 2012/0247671 A1 | 10/2012 | Sugawara | |

(Continued)

FOREIGN PATENT DOCUMENTS

CN    100485859    5/2009
CN    102376612    3/2012

(Continued)

*Primary Examiner* — Nadine G Norton
*Assistant Examiner* — Christopher Remavege
(74) *Attorney, Agent, or Firm* — IPUSA, PLLC (57) ABSTRACT

A method performed by a processor of a plasma processing system including a transfer device and a plasma processing apparatus that includes a process chamber. The process chamber includes a mount table on a surface of which a first focus ring is placed. The method includes controlling the transfer device to transfer the first focus ring out of the process chamber without opening the process chamber to the atmosphere; after the first focus ring is transferred out of the process chamber, controlling the plasma processing apparatus to clean the surface of the mount table; and after the surface of the mount table is cleaned, controlling the transfer device to transfer a second focus ring into the process chamber and place the second focus ring on the surface of the mount table without opening the process chamber to the atmosphere.

19 Claims, 9 Drawing Sheets

(56) References Cited

U.S. PATENT DOCUMENTS

| | | | | |
|---|---|---|---|---|
| 2014/0069459 A1* | 3/2014 | Guan | ............... | H05H 1/24 |
| | | | | 134/1.1 |
| 2015/0340209 A1* | 11/2015 | Koltonski | ......... | H01J 37/32715 |
| | | | | 156/345.31 |
| 2016/0363556 A1* | 12/2016 | Sugita | ................ | G01N 27/24 |
| 2017/0069463 A1* | 3/2017 | Kang | ............... | H01J 37/3244 |
| 2017/0117172 A1* | 4/2017 | Genetti | ............ | H01L 21/67742 |
| 2017/0200588 A1* | 7/2017 | Joubert | ................ | C23C 4/02 |
| 2017/0213758 A1* | 7/2017 | Rice | ................ | H01L 21/68735 |
| 2018/0068879 A1* | 3/2018 | Wong | ............... | H01L 21/67167 |
| 2018/0233328 A1* | 8/2018 | Ueda | ................ | H01J 37/3288 |

FOREIGN PATENT DOCUMENTS

| | | |
|---|---|---|
| CN | 102738048 | 10/2012 |
| JP | 2005-101539 | 4/2005 |
| JP | 2006-253541 | 9/2006 |

\* cited by examiner

FOCUS RING REPLACEMENT METHOD AND PLASMA PROCESSING SYSTEM

CROSS-REFERENCE TO RELATED APPLICATION

The present application is based upon and claims the benefit of priority of Japanese Patent Application No. 2016-139681, filed on Jul. 14, 2016, the entire contents of which are incorporated herein by reference.

BACKGROUND OF THE INVENTION

1. Field of the Invention

An aspect of this disclosure relates to a focus ring replacement method and a plasma processing system.

2. Description of the Related Art

A known plasma processing apparatus performs plasma processing on a substrate placed on a mount table disposed in a process chamber. Such a plasma processing apparatus includes consumable parts that gradually wear as a result of repeatedly performing plasma processing (see, for example, Japanese Laid-Open Patent Publication No. 2006-253541).

One example of a consumable part is a focus ring that is disposed to surround a substrate placed on the upper surface of the mount table. The focus ring is abraded due to exposure to plasma and therefore needs to be periodically replaced.

In a related-art method, a focus ring is replaced manually by an operator after opening the process chamber to the atmosphere.

However, with the related-art method where the process chamber is opened to the atmosphere, it takes a long time to replace a focus ring. Also, because it is not possible to process substrates in the process chamber while replacing the focus ring, the related-art method reduces productivity.

SUMMARY OF THE INVENTION

In an aspect of this disclosure, there is provided a method performed by a processor of a plasma processing system including a transfer device and a plasma processing apparatus. The plasma processing apparatus includes a process chamber, and the process chamber includes a mount table on a surface of which a first focus ring is placed. The method includes controlling the transfer device to transfer the first focus ring out of the process chamber without opening the process chamber to the atmosphere; after the first focus ring is transferred out of the process chamber, controlling the plasma processing apparatus to clean the surface of the mount table; and after the surface of the mount table is cleaned, controlling the transfer device to transfer a second focus ring into the process chamber and place the second focus ring on the surface of the mount table without opening the process chamber to the atmosphere.

DESCRIPTION OF THE PREFERRED EMBODIMENTS

Embodiments of the present invention are described below with reference to the accompanying drawings. In the specification and the drawings of the present application, the same reference number is assigned to substantially the same components, and repeated descriptions of those components are omitted.

In a focus ring replacement method according to an embodiment, a focus ring is transferred out of a process chamber by a transfer device without opening the process chamber to the atmosphere, the process chamber is cleaned, and another focus ring is transferred into the process chamber by the transfer device. A focus ring is disposed in a process chamber to surround a substrate placed on the upper surface of a mount table, and is used to improve the uniformity of etching.

A focus ring replacement method of the present embodiment can be applied to various types of plasma processing apparatuses including a focus ring.

<Plasma Processing System>

Figure 1:
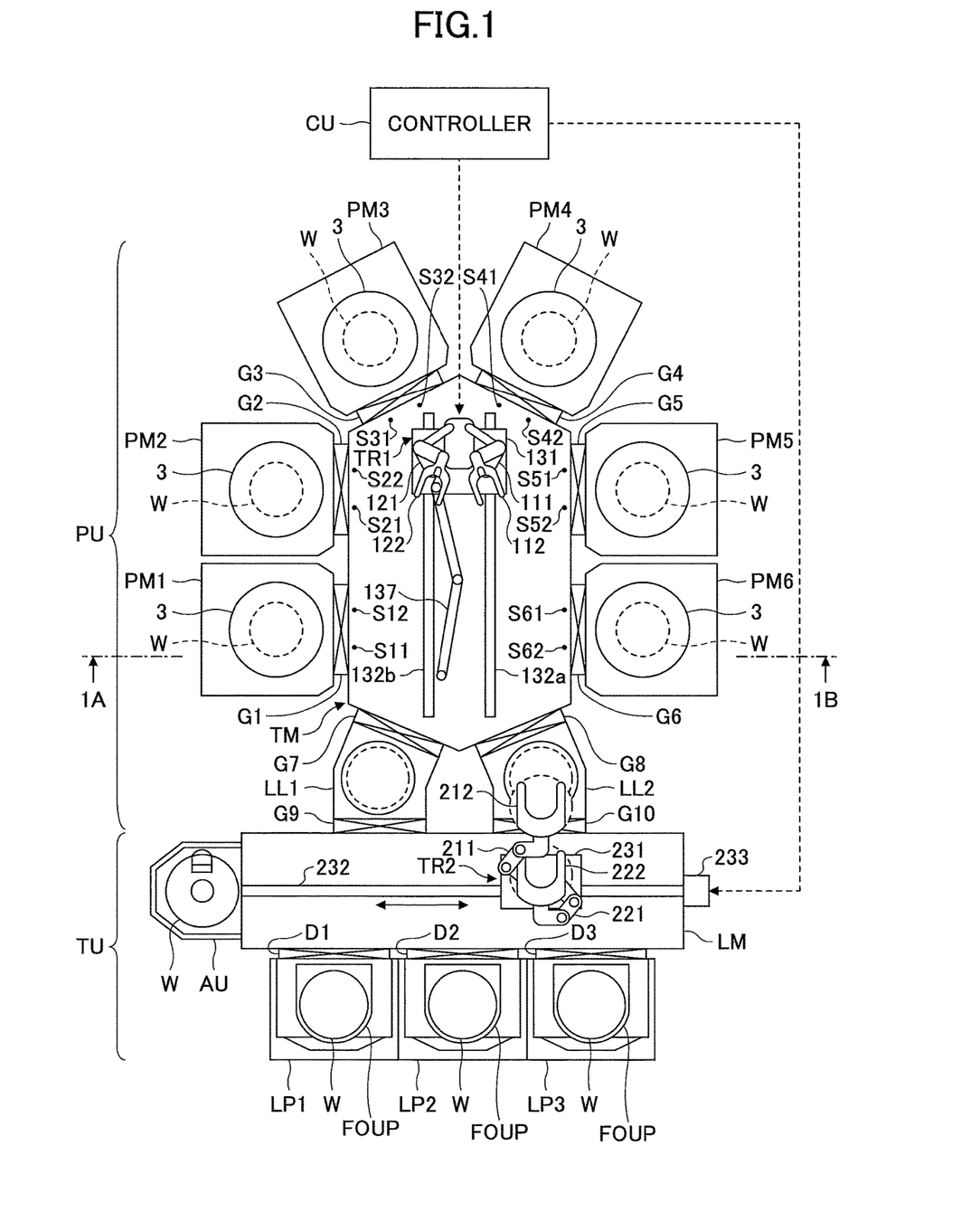
FIG. 1 is a schematic diagram of a plasma processing system according to an embodiment.

A plasma processing system according to an embodiment is described below. FIG. 1 is a schematic diagram of a plasma processing system according to an embodiment.

As illustrated by FIG. 1, the plasma processing system is a cluster tool including a process unit PU and a transfer unit TU.

The process unit PU performs processes such as a film deposition process and an etching process on substrates such as semiconductor wafers (which are hereafter referred to as "wafers W"). The process unit PU includes process modules PM1 through PM6, a transfer module TM, and load lock modules LL1 and LL2. The number of process modules PM and the number of load lock modules LL are not limited to the above examples.

The process modules PM1 through PM6 are connected to the transfer module TM and arranged around the transfer module TM. Each of the process modules PM1 through PM6 performs a process such as a film deposition process or an etching process on the wafer W. The process modules PM1 through PM6 may be configured to perform the same type of process or different types of processes.

A mount table 3, on which the wafer W is to be placed, is provided in each of the process modules PM1 through PM6. Also, for example, a purge gas supply system, a process gas supply system, and an evacuation system (not shown) may be provided for the process modules PM1 through PM6.

In each of the process modules PM1 through PM6, a process is performed on the wafer W according to a recipe stored in, for example, a memory of a controller CU and indicating process steps. Also, for each of the process modules PM1 through PM6, a focus ring is replaced at predetermined timing stored in, for example, a memory of the controller CU. Details of the process modules PM and the focus ring replacement method are described later.

The transfer module TM has a hexagonal shape where a pair of opposing sides are longer than other sides. The process modules PM3 and PM4 are connected via gate valves G3 and G4 to two short sides of the transfer module TM at the front end of the transfer module TM. The load lock modules LL1 and LL2 are connected via gate valves G7 and G8 to two short sides of the transfer module TM at the rear end of the transfer module TM. The process modules PM1 and PM2 are connected via gate valves G1 and G2 to one of two long sides of the transfer module TM. The process modules PM5 and PM6 are connected via gate valves G5 and G6 to the other one of the two long sides of the transfer module TM.

The transfer module TM has a function to transfer wafers W and focus rings between the process modules PM1 through PM6 and between the process modules PM1 through PM6 and the load lock modules LL1 and LL2 (or transfer wafers W and focus rings into and out of those components). For example, a purge gas supply system and an evacuation system (not shown) may be provided for the transfer module TM.

The transfer module TM includes a process-unit-side transfer device TR1 that transfers wafers W and focus rings between the process modules PM1 through PM6 and the load lock modules LL1 and LL2. Details of the process-unit-side transfer device TR1 are described later.

Position detection sensors S11 and S12 are provided at positions that are near the gate valve G1 of the transfer module TM and on a transfer route along which the wafer W and a focus ring are transferred from the transfer module TM to the process module PM1. The position detection sensors S11 and S12 are arranged such that the distance between the position detection sensors S11 and S12 is less than the outside diameter of the wafer W and the inside diameter of the focus ring. The position detection sensors S11 and S12 make it possible to correct the positions of the wafer W and the focus ring being transferred to the process module PM1. Details of the position detection sensors S11 and S12 are described later.

In addition to the position detection sensors S11 and S12, position detection sensors S21, S22, S31, S32, S41, S42, S51, S52, S61, and S62 are provided at the corresponding positions that are near the gate valves G2 through G6 of the transfer module TM and on transfer routes along which wafers W and focus rings are transferred from the transfer module TM to the process modules PM2 through PM6.

The load lock modules LL1 and LL2 are connected via gate valves G9 and G10 to a transfer module LM. Each of the load lock modules LL1 and LL2 has a function to temporarily hold the wafer W transferred from the transfer module LM and transfer the wafer W to the transfer module TM after pressure regulation. Also, each of the load lock modules LL1 and LL2 has a function to temporarily hold the wafer W transferred from the transfer module TM and transfer the wafer W to the transfer module LM after pressure regulation.

A transfer table, on which the wafer W can be placed, is provided in each of the load lock modules LL1 and LL2. Also, an evacuation system (not shown) may be provided for the load lock modules LL1 and LL2 to purge, for example, particles of residues and evacuate the load lock modules LL1 and LL2.

With the process unit PU configured as described above, the paths between the process modules PM1 through PM6 and the transfer module TM and between the transfer module TM and the load lock modules LL1 and LL2 can be opened and closed while keeping the process unit PU airtight. Also, the paths between the transfer module LM and the load lock modules LL1 and LL2 can be opened and closed while keeping the process unit PU airtight.

The transfer unit TU transfers the wafer W between a front opening unified pod (FOUP) described later and the process unit PU, and includes the transfer module LM.

The transfer module LM has a rectangular shape. Load ports LP1 through LP3 are provided on one of the long sides of the transfer module LM. A FOUP can be placed on each of the load ports LP1 through LP3. In the example of FIG. 1, a FOUP is placed on every one of the load ports LP1 through LP3. The FOUP is a container that can house multiple (e.g., 25) wafers W stacked at a constant pitch. The FOUP has an airtight structure that is filled with, for example, an $N_2$ gas. In FIG. 1, FOUPs are connected via opening-closing doors D1 through D3 to the transfer module LM. The number of load ports LP is not limited to the above example.

An aligner AU is provided on one of the short sides of the transfer module LM. The aligner AU includes a rotary table on which the wafer W is to be placed, and an optical sensor that optically detects the outer edge of the wafer W. The aligner AU detects an orientation flat or a notch of the wafer W and adjusts the orientation of the wafer W.

The transfer module LM includes a transfer-unit-side transfer device TR2 that transfers wafers W and focus rings between the load lock modules LL1 and LL2, the FOUPs, and the aligner AU. The transfer-unit-side transfer device TR2 includes a transfer arm that is attached to a base 231 and can be rotated by a rotating mechanism. The transfer-unit-side transfer device TR2 can be slid in the longitudinal direction of the transfer module LM by a sliding mechanism. For example, the transfer arm of the transfer-unit-side transfer device TR2 is a double-arm mechanism including a pair of multi-joint arms. In the example of FIG. 1, the transfer arm includes a first arm 211 and a second arm 221 implemented by multi-joint arms. The first arm 211 and the second arm 221 are arranged vertically and can be extended and retracted.

The sliding mechanism for sliding the transfer-unit-side transfer device TR2 includes, for example, a linear motor. More specifically, the transfer module LM includes a guide rail 232 extending in the longitudinal direction of the transfer module LM. The base 231 to which the transfer arm is attached can slide along the guide rail 232. A mover and a stator are provided on the base 231 and the guide rail 232, respectively. A linear motor driving mechanism 233 for driving the linear motor is provided at an end of the guide rail 232. The controller CU is connected to the linear motor driving mechanism 233. The linear motor driving mechanism 233 is driven according to a control signal from the controller CU, and causes the transfer-unit-side transfer device TR2 to move together with the base 231 along the guide rail 232 in directions indicated by arrows. The sliding mechanism for driving the transfer-unit-side transfer device TR2 is not limited to the above-described example.

A pick 212 is provided at an end of the first arm 211 and a pick 222 is provided at an end of the second arm 221 so that the transfer-unit-side transfer device TR2 can hold two wafers W or two focus rings at a time. With this configuration, the transfer-unit-side transfer device TR2 can transfer and receive wafers W and focus rings to and from the load lock modules LL1 and LL2, the FOUPs, and the aligner AU. The transfer-unit-side transfer device TR2 may hold and transfer one wafer W and one focus ring at a time. The number of transfer arms of the transfer-unit-side transfer device TR2 is not limited to the above-described example, and the transfer-unit-side transfer device TR2 may be implemented as a single-arm mechanism including one arm.

The transfer-unit-side transfer device TR2 also includes a rotation motor, an extension motor, and an elevation motor (not shown) for rotating, extending, retracting, raising, and lowering the transfer arms. Each of the motors is connected to the controller CU, and moves the transfer arms of the transfer-unit-side transfer device TR2 according to a control signal from the controller CU.

Thus, the plasma processing system includes the controller CU that controls components of the plasma processing system such as the process-unit-side transfer device TR1, the transfer-unit-side transfer device TR2, the gate valves G1 through G10, the opening-closing doors D1 through D3, and the aligner AU. The controller CU is, for example, a computer including a central processing unit (CPU) (processor) and a memory storing a program. A focus ring replacement method described later may be performed by the processor by executing the program stored in the memory.

<Plasma Processing Apparatus>

Figure 2:
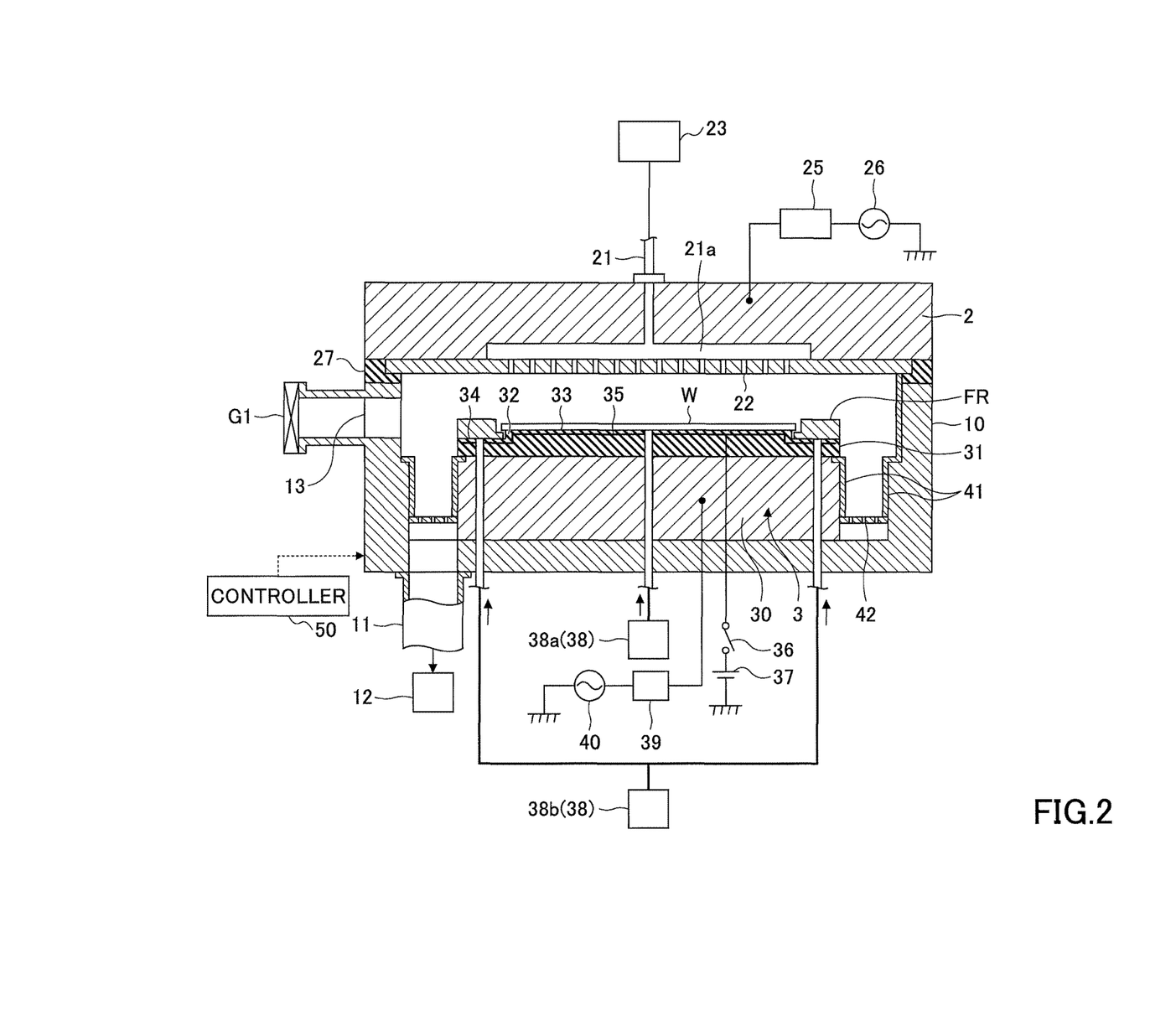
FIG. 2 is a cross-sectional view of a plasma processing apparatus according to an embodiment.

A plasma processing apparatus according to an embodiment is described with reference to FIG. 2. FIG. 2 is a cross-sectional view of the plasma processing apparatus. The plasma processing apparatus of FIG. 2 can be used as any one of the process modules PM1 through PM6 of the plasma processing system of FIG. 1.

As illustrated in FIG. 2, the plasma processing apparatus includes a process chamber 10 having a substantially-cylindrical shape. The inner wall of the process chamber 10 may be formed of, for example, anodized aluminum. The process chamber 10 is grounded.

The process chamber 10 includes a gas shower head 2 for introducing a process gas into the process chamber 10. The gas shower head 2 also functions as an upper electrode. A mount table 3 is disposed in the process chamber 10 to face the gas shower head 2. The mount table 3 also functions as a lower electrode.

Gas discharge openings 22 are formed in the lower side of the gas shower head 2 (upper electrode). The gas discharge openings 22 communicate via a buffer chamber 21a with a gas supply line 21. From the gas discharge openings 22, a process gas is discharged toward a wafer W placed on the mount table 3. The gas supply line 21 is connected to a gas supply system 23.

The gas supply system 23 includes a supply source that supplies a process gas used for a film deposition process performed on the wafer W, and a supply source that supplies a process gas used for an etching process performed on the wafer W. The gas supply system 23 also includes a supply source that supplies a process gas used for a cleaning process of the process chamber 10, and a supply source that supplies a process gas used for a seasoning process of the process chamber 10. The gas supply system 23 includes supply control devices such as valves and flow controllers, and can supply process gases into the process chamber 10 at specified flow rates.

A high-frequency power supply 26 for supplying high-frequency power is connected via a matching box 25 to the gas shower head 2 (upper electrode). The gas shower head 2 is insulated by an insulating part 27 from the side walls of the process chamber 10.

The mount table 3 includes a body 30 and an electrostatic chuck 31.

The body 30 may be formed of a conductive material such as aluminum. A refrigerant flow path (not shown) that functions as a temperature control mechanism is provided in the body 30. The temperature of the wafer W held by the electrostatic chuck 31 is controlled by controlling the temperature of the refrigerant supplied to the refrigerant flow path.

The electrostatic chuck 31 is provided on the body 30 and can attract both the wafer W and a focus ring FR disposed to surround the wafer W. A raised substrate mounting part 32 is formed in the upper center portion of the electrostatic chuck 31. The upper surface of the substrate mounting part 32 forms a substrate mounting surface 33 on which the wafer W is to be placed. The upper surface of a lower portion of the electrostatic chuck 31 surrounding the substrate mounting surface 33 forms a focus-ring mounting surface 34.

The electrostatic chuck 31 has a structure formed by sandwiching an electrode 35 between insulators. The electrode 35 is provided not only below the substrate mounting surface 33 but also below the focus-ring mounting surface 34 so that the electrostatic chuck 31 can attract both the wafer W and the focus ring FR.

A direct-current power supply 37 is connected via a switch 36 to the electrode 35 to apply a direct-current voltage to the electrostatic chuck 31. When the direct-current voltage is applied, the electrostatic chuck 31 electrostatically attracts the wafer W and the focus ring FR. As exemplified in FIG. 2, the substrate mounting part 32 may have a diameter smaller than the diameter of the wafer W so that the outer edge of the wafer W placed on the substrate mounting part 32 protrudes over the edge of the substrate mounting part 32.

A heat-transfer-gas supply system 38 is provided for the mount table 3 to supply heat-transfer gases (e.g., a helium (He) gas) separately to the back side of the wafer W and the back side of the focus ring FR.

The heat-transfer-gas supply system 38 includes a first heat-transfer-gas supply part 38a that supplies a first heat-transfer gas to the back side of the wafer W placed on the substrate mounting surface 33 and a second heat-transfer-gas supply part 38b that supplies a second heat-transfer gas to the back side of the focus ring FR placed on the focus-ring mounting surface 34.

The focus ring FR is placed on the electrostatic chuck 31. A step is formed in the upper side of the focus ring FR such that the outer circumferential part of the focus ring FR becomes higher than the inner circumferential part of the focus ring FR. Also, the inner circumferential part of the focus ring FR is configured to enter a space below the outer edge of the wafer W protruding over the edge of the substrate mounting part 32. Thus, the inside diameter of the focus ring FR is smaller than the outside diameter of the wafer W. This configuration makes it possible to protect the electrostatic chuck 31 from plasma during an etching process performed on the wafer W.

A high-frequency power supply 40 for supplying bias power is connected via a matching box 39 to the mount table 3. Also, elevating pins (not shown) are provided in the mount table 3. The elevating pins are used to pass and receive the wafer W and the focus ring FR to and from the process-unit-side transfer device TR1 illustrated in FIG. 1. When passing the focus ring FR to the process-unit-side transfer device TR1, the elevating pins are raised to lift the focus ring FR from the mount table 3.

An opening 13 is formed in the side wall of the process chamber 10, and a gate valve G1 is provided to open and close the opening 13. The wafer W and the focus ring FR are transferred through the opening 13.

A detachable deposit shield 41 is provided on the inner wall of the process chamber 10. The deposit shield 41 is also provided on the outer surface of the mount table 3. The deposit shield 41 prevents a reaction product of an etching process from adhering to the inner wall of the process chamber 10, and is formed, for example, by coating aluminum with ceramic such as $Y_2O_3$.

A baffle plate 42 having a large number of exhaust holes is provided around the mount table 3 to uniformly evacuate the process chamber 10. The baffle plate 42 is formed, for example, by coating aluminum with ceramic such as $Y_2O_3$. A vacuum pump 12 such as a turbo molecular pump or a dry pump is connected to an evacuation pipe 11 below the baffle plate 42.

The plasma processing apparatus includes a controller 50 for controlling other components of the plasma processing apparatus. The controller 50 is, for example, a computer including a central processing unit (CPU) and a program. The program includes, for example, steps (instructions) for controlling the supply of gases from the gas supply system 23 and the supply of power from the high-frequency power supplies 26 and 40 to perform processes such as a film deposition process and an etching process on the wafer W. The program may be stored in a storage medium such as a hard disk drive, a compact disk, or a memory card, and installed from the storage medium into the computer.

<Focus Ring Replacement Method>

Figure 3:
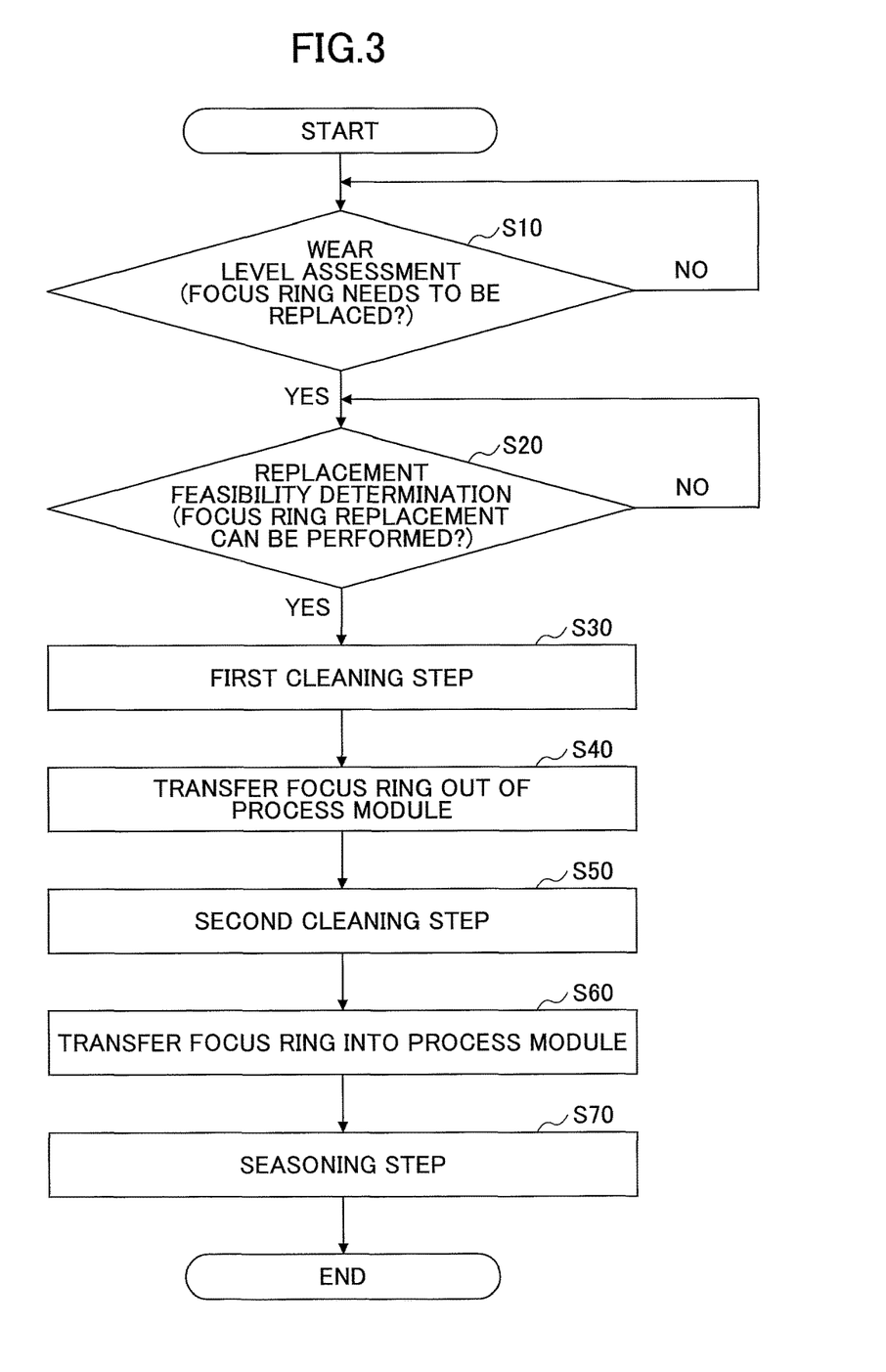
FIG. 3 is a flowchart illustrating a focus ring replacement method according to an embodiment.

A focus ring replacement method according to an embodiment is described with reference to FIG. 3. FIG. 3 is a flowchart illustrating a focus ring replacement method according to an embodiment.

In the example below, it is assumed that the focus ring FR on the mount table 3 of the process module PM1 is replaced. More specifically, it is assumed that a used focus ring is carried out of the process module PM1 and placed in the FOUP, and an unused focus ring placed beforehand in the FOUP is installed in the process module PM1. Focus rings FR on the mount tables 3 of the process modules PM2 through PM6 may also be replaced according to the focus ring replacement method described below. The focus ring replacement method of the present embodiment is performed by the controller CU by controlling the components of the plasma processing system.

As illustrated by FIG. 3, the focus ring replacement method of the present embodiment includes a wear level assessment step S10, a replacement feasibility determination step S20, a first cleaning step S30, a carry-out step S40, a second cleaning step S50, a carry-in step S60, and a seasoning step S70. Each of the steps is described below.

The wear level assessment step S10 is performed to determine whether the focus ring FR on the mount table 3 of the process module PM1 needs to be replaced. At the wear level assessment step S10, the controller CU determines whether the focus ring FR on the mount table 3 of the process module PM1 needs to be replaced. More specifically, the controller CU determines whether the focus ring FR needs to be replaced based on one or more of criteria such as a total RF time, a total RF power, and a total specific-step value. The total RF time indicates a total amount of time for which high-frequency power is supplied to the process module PM1 to perform plasma processing. The total RF power indicates a total amount of high-frequency power supplied to the process module PM1 to perform plasma processing. The total specific-step value indicates, for example, a total amount of time for which high-frequency power is supplied to perform a specific step(s) or a total amount of high-frequency power that is supplied to perform the specific step(s). The specific step indicates a type of step in a recipe that is performed in the process module PM1 and causes abrasion of the focus ring FR. The calculations of the total RF time, the total RF power, and the total specific-step value are started, for example, when the process module PM1 is installed, when maintenance of the process module PM1 is performed, or when the focus ring FR is replaced.

For example, when the total RF time is used as a criterion, the controller CU determines that the focus ring FR needs to be replaced when the total RF time reaches a threshold. In contrast, the controller CU determines that replacement of the focus ring RF is not necessary when the total RF time is less than the threshold. The threshold may be determined by, for example, according to a result of an experiment performed for each type or material of the focus ring FR.

When the total RF power is used as a criterion, the controller CU determines that the focus ring FR needs to be replaced when the total RF power reaches a threshold. In contrast, the controller CU determines that replacement of the focus ring RF is not necessary when the total RF power is less than the threshold. The threshold may be determined by, for example, according to a result of an experiment performed for each type or material of the focus ring FR.

When the total specific-step value is used as a criterion, the controller CU determines that the focus ring FR needs to be replaced when the total RF time or the total RF power for the specific step reaches a threshold. In contrast, the controller CU determines that replacement of the focus ring RF is not necessary when the total RF time or the total RF power for the specific step is less than the threshold. When the total specific-step value is used as a criterion, the timing of replacing the focus ring FR is calculated based on a value related to a step in a recipe where high-frequency power is applied and the focus ring FR is abraded. This makes it possible to accurately calculate the timing of replacing the focus ring FR. The threshold may be determined by, for example, according to a result of an experiment performed for each type or material of the focus ring FR.

When it is determined, at the wear level assessment step S10, that the focus ring FR on the mount table 3 of the process module PM1 needs to be replaced, the controller CU performs the replacement feasibility determination step S20. When it is determined, at the wear level assessment step S10, that the focus ring FR on the mount table 3 of the process module PM1 does not need to be replaced, the controller CU performs repeats the wear level assessment step S10.

The replacement feasibility determination step S20 is performed to determine whether the plasma processing system is in a state where the replacement of the focus ring FR can be performed. At the replacement feasibility determination step S20, the controller CU determines whether the plasma processing system is in a state where the replacement of the focus ring FR can be performed. For example, the controller CU determines that the replacement of the focus ring FR in the process module PM1 can be performed when the wafer W is not being processed in the process module PM1. In contrast, the controller CU determines that the replacement of the focus ring RF cannot be performed when the wafer W is being processed in the process module PM1. Also, the controller CU may be configured to determine that the replacement of the focus ring FR in the process module PM1 can be performed when the processing of wafers W in the same lot as the wafer W being processed in the process module PM1 is completed. In this case, the controller CU determines that the replacement of the focus ring FR cannot be performed until the processing of wafers W in the same lot as the wafer W being processed in the process module PM1 is completed.

When it is determined, at the replacement feasibility determination step S20, that the plasma processing system is in a state where the replacement of the focus ring FR can be performed, the controller CU performs the first cleaning step S30. When it is determined, at the replacement feasibility determination step S20, that the plasma processing system is in a state where the replacement of the focus ring FR cannot be performed, the controller CU repeats the replacement feasibility determination step S20.

The first cleaning step S30 is performed to clean the process module PM1. At the first cleaning step S30, the control unit CU performs a cleaning process on the process module PM1 by controlling the gas supply system, the evacuation system, and the power supply system. In the cleaning process, deposits generated by plasma processing in the process module PM1 are removed using, for example, plasma of a process gas to maintain the inside of the process module PM1 in a clean state. Performing the first cleaning step S30 makes it possible to prevent deposits in the process chamber 10 from being stirred up when the focus ring FR is transferred from the mount table 3 at the carry-out step S40. Examples of process gases include an oxygen ($O_2$) gas, a fluorocarbon (CF) gas, a nitrogen ($N_2$) gas, an argon (Ar) gas, a helium (He) gas, and a mixed gas of two or more of these gases. Depending on process conditions, a dummy wafer W may be placed on the electrostatic chuck 31 of the mount table 3 during the cleaning process of the process module PM1 to protect the electrostatic chuck 31. When no deposit is present in the process chamber 10 and is likely to be stirred up, the first cleaning step S30 may be omitted. When the focus ring FR is being attracted to the mount table 3 by the electrostatic chuck 31, a disellectrification process is performed before the carry-out step S40.

The carry-out step S40 is performed to transfer the focus ring FR out of the process module PM1 without opening the process module PM1 to the atmosphere. At the carry-out step S40, the controller CU controls the components of the plasma processing system to transfer the focus ring FR out of the process module PM1 without opening the process module PM1 to the atmosphere. More specifically, the controller CU opens the gate valve G1, and controls the process-unit-side transfer device TR1 to transfer the focus ring FR on the mount table 3 of the process module PM1 out of the process module PM1. Next, the controller CU opens the gate valve G8, and controls the process-unit-side transfer device TR1 to place the focus ring FR transferred out of the process module PM1 on the transfer table in the load lock module LL2. Next, the controller CU closes the gate valve G8, regulates the pressure in the load lock module LL2, opens the gate valve G10, and controls the transfer-unit-side transfer device TR2 to transfer the focus ring FR from the transfer table to the transfer module LM. Then, the controller CU opens the opening-closing door D3, and controls the transfer-unit-side transfer device TR2 to place the focus ring FR in the FOUP placed on the load port LP3.

The second cleaning step S50 is performed to clean the surface (the focus-ring mounting surface 34) of the mount table 3 of the process module PM1 on which the focus ring FR is placed. At the second cleaning step S50, the control unit CU performs a cleaning process on the surface of the mount table 3 of the process module PM1 on which the focus ring FR is placed by controlling the gas supply system, the evacuation system, and the power supply system. The cleaning process in the second cleaning step S50 may be performed in a manner similar to the cleaning process in the first cleaning step S30. That is, the cleaning process in the second cleaning step S50 may be performed using a process gas such as an oxygen ($O_2$) gas, a fluorocarbon (CF) gas, a nitrogen ($N_2$) gas, an argon (Ar) gas, a helium (He) gas, or a mixed gas of two or more of these gases. Also, depending on process conditions, a dummy wafer W may be placed on the electrostatic chuck 31 of the mount table 3 during the cleaning process of the process module PM1 to protect the electrostatic chuck 31.

The carry-in step S60 is performed to transfer the focus ring FR into the process module PM1 and place the focus ring FR on the mount table 3 without opening the process module PM1 to the atmosphere. At the carry-in step S60, the controller CU controls the components of the plasma processing system to transfer the focus ring FR into the process module PM1 without opening the process module PM1 to the atmosphere. More specifically, the controller CU opens the opening-closing door D3, and controls the transfer-unit-side transfer device TR2 to transfer an unused focus ring FR out of the FOUP placed on the load port LP3. Next, the controller CU opens the gate valve G9, and controls the transfer-unit-side transfer device TR2 to place the unused focus ring FR on the transfer table in the load lock module LL1. Then, the controller CU opens the gate valve G7 and the gate valve G1, and controls the process-unit-side transfer device TR1 to transfer the unused focus ring FR from the transfer table in the load lock module LL1 into the process module PM1 and place the unused focus ring FR on the mount table 3.

The seasoning step S70 is performed to season the process module PM1. At the seasoning step S70, the control unit CU performs a seasoning process on the process module PM1 by controlling the gas supply system, the evacuation system, and the power supply system. In the seasoning process, predetermined plasma processing is performed to stabilize the temperature and the state of deposits in the process module PM1. Also in the seasoning step S70, after the seasoning process is performed on the process module PM1, a quality-control wafer may be placed in the process module PM1 and a predetermined process may be performed on the quality-control wafer. This makes it possible to determine whether the process module PM1 is in a normal state.

The focus ring FR can be replaced through the steps described above.

As described above, in the focus ring replacement method of the present embodiment, the focus ring FR is transferred out of the process chamber 10 by using the process-unit-side transfer device TR1, the process chamber 10 is cleaned, and an unused focus ring FR is transferred into the process chamber 10 by using the process-unit-side transfer device TR1 without opening the process chamber 10 to the atmosphere. This method eliminates the need for an operator to manually replace the focus ring FR. This in turn makes it possible to reduce the time necessary to replace the focus ring FR and improves the productivity. Also in the focus ring replacement method of the present embodiment, the focus-ring mounting surface 34 is cleaned before the focus ring FR is transferred into the process chamber 10. This makes it possible to prevent deposits from being placed between the focus ring FR and the focus-ring mounting surface 34. This in turn makes it possible to improve contact between the focus ring FR and the focus-ring mounting surface 34, and thereby makes it possible to better control the temperature of the focus ring FR.

<Process-Unit-Side Transfer Device>

Figure 4:
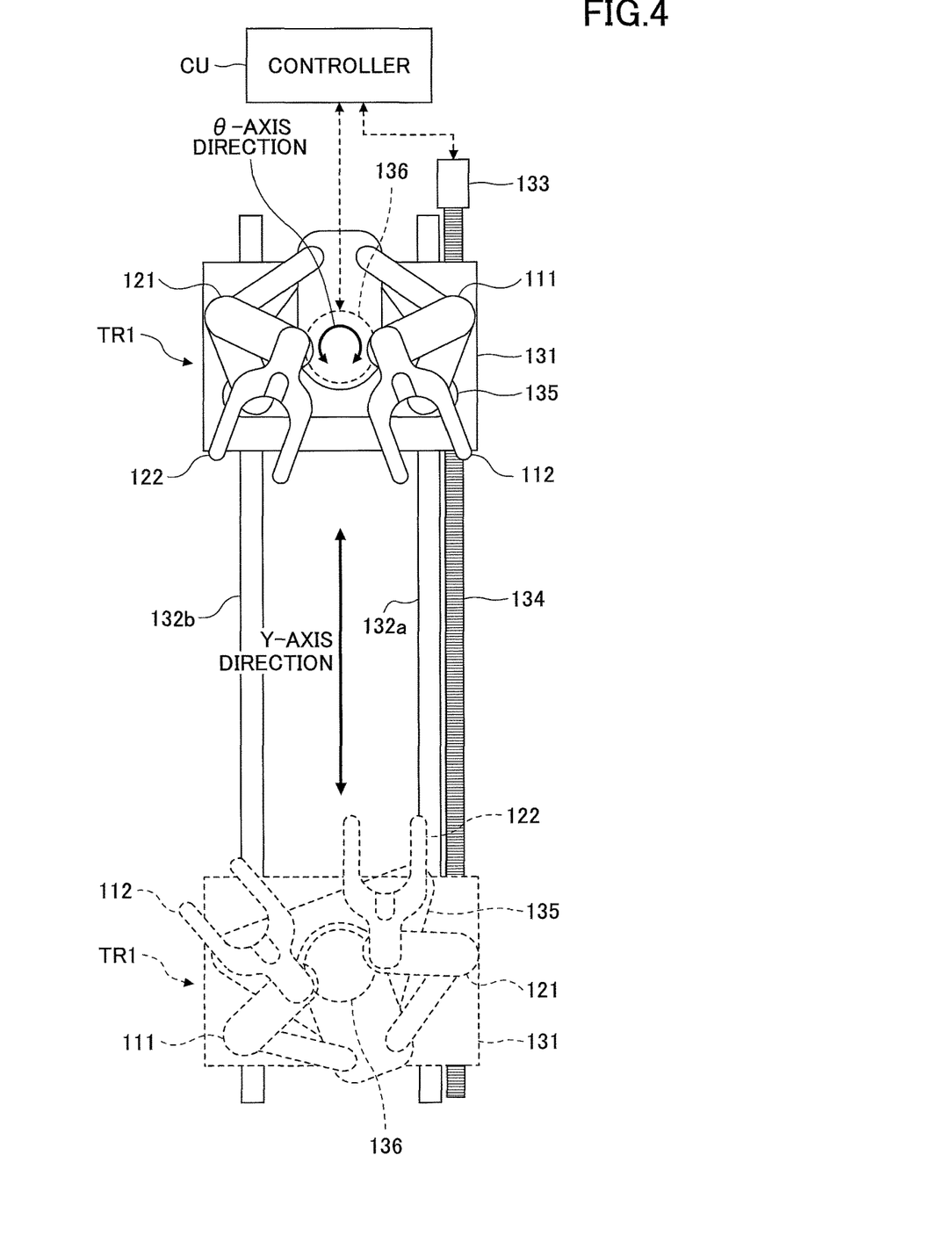
FIG. 4 is a drawing illustrating an example of a configuration of a process-unit-side transfer device.

Next, an example of a configuration of the process-unit-side transfer device TR1 is described with reference to FIG. 4. FIG. 4 is a drawing illustrating an example of a configuration of the process-unit-side transfer device TR1.

First, a sliding mechanism of the process-unit-side transfer device TR1 is described. As illustrated in FIG. 4, transfer arms (a first arm 111 and a second arm 121) of the process-unit-side transfer device TR1 are attached to a base 131. The base 131 is slidable on guide rails 132a and 132b in a Y-axis direction (the longitudinal direction of the transfer module TM). For example, a ball screw 134 driven by a Y-axis motor 133 is attached to the base 131. The sliding movement of the transfer arms of the process-unit-side transfer device TR1 can be controlled by controlling the Y-axis motor 133.

Next, a rotating mechanism of the process-unit-side transfer device TR1 is described. As illustrated in FIG. 4, the transfer arms (the first arm 111 and the second arm 121) of the process-unit-side transfer device TR1 are attached via a rotary plate 135 to the base 131. The rotary plate 135 is rotatable in the direction of a θ axis that is a rotational axis. For example, the rotary plate 135 is rotated by a θ-axis motor 136 provided on the base 131. The rotational movement of the transfer arms of the process-unit-side transfer device TR1 can be controlled by controlling the θ-axis motor 136.

A pick 112 is provided at an end of the first arm 111, and a pick 122 is provided at an end of the second arm 121 so that the process-unit-side transfer device TR1 can hold two wafers W or two focus rings FR at a time. With this configuration, the process-unit-side transfer device TR1 can transfer and receive wafers W and focus rings FR to and from the process modules PM1 through PM6 and the load lock modules LL1 and LL2. The number of transfer arms of the process-unit-side transfer device TR1 is not limited to the above-described example, and the process-unit-side transfer device TR1 may be implemented as a single-arm mechanism including one arm.

The process-unit-side transfer device TR1 also includes an extension motor (not shown) for extending and retracting the transfer arms. For example, the extension motor is provided below the θ-axis motor 136, and is controllable separately from the θ-axis motor 136. The process-unit-side transfer device TR1 may further include an elevation motor (not shown) for raising and lowering the transfer arms.

Each of the motors including the θ-axis motor 136 and the Y-axis motor 133 for driving the process-unit-side transfer device TR1 is connected to the controller CU, and is driven according to a command from the controller CU.

As illustrated in FIG. 1, a flexible arm 137 is connected to the base 131 of the process-unit-side transfer device TR1. Wires for the motors such as θ-axis motor 136 pass through the flexible arm 137. The flexible arm 137 may be implemented by, for example, a tubular arm mechanism. The flexible arm 137 is hermetically connected to the base 131, and the inside of the flexible arm 137 communicates with the atmosphere via a hole formed in the bottom of the transfer module TM. With this configuration, even when the inside of the transfer module TM is at a vacuum pressure, the inside of the flexible arm 137 is at the atmospheric pressure. Accordingly, this configuration makes it possible to prevent the wires in the flexible arm 137 from being damaged.

As described above, the process-unit-side transfer device TR1 can be slid along the guide rails 132a and 132b, and the transfer arms of the process-unit-side transfer device TR1 can be extended and retracted. With this configuration, the process-unit-side transfer device TR1 can transfer wafers W and focus rings FR between the process modules PM1 through PM6 and the load lock modules LL1 and LL2.

Figure 5A:
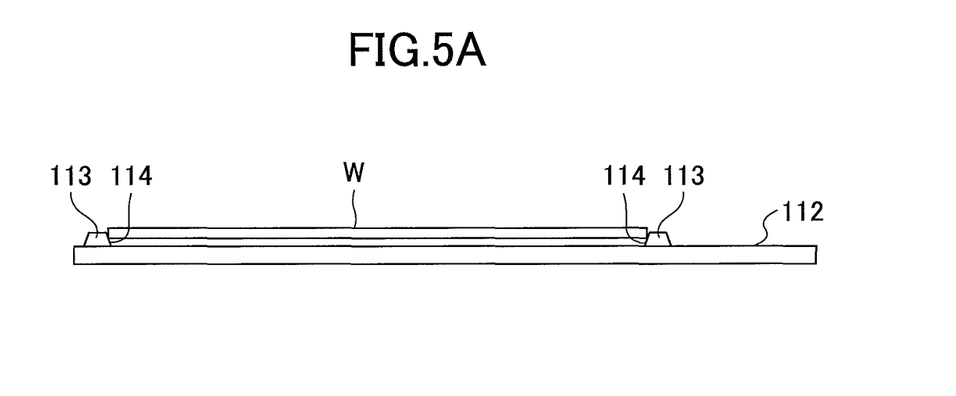
FIGS. 5A and 5B are drawings illustrating a pick of a process-unit-side transfer device holding a wafer.
Figure 5B:
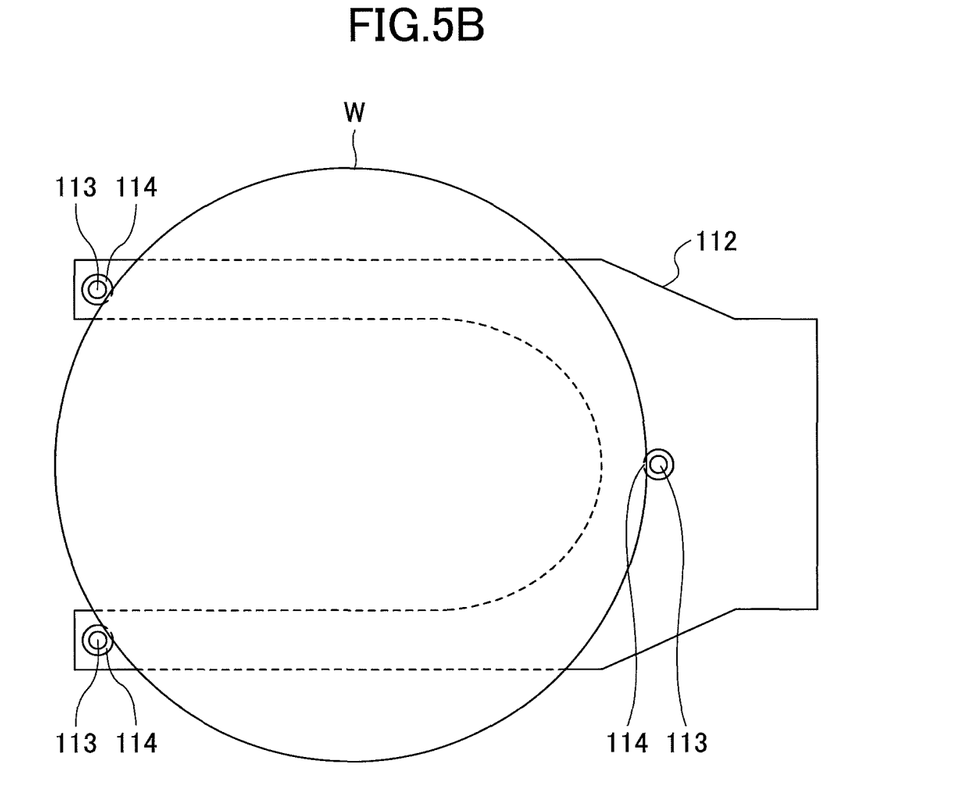
Figure 6A:
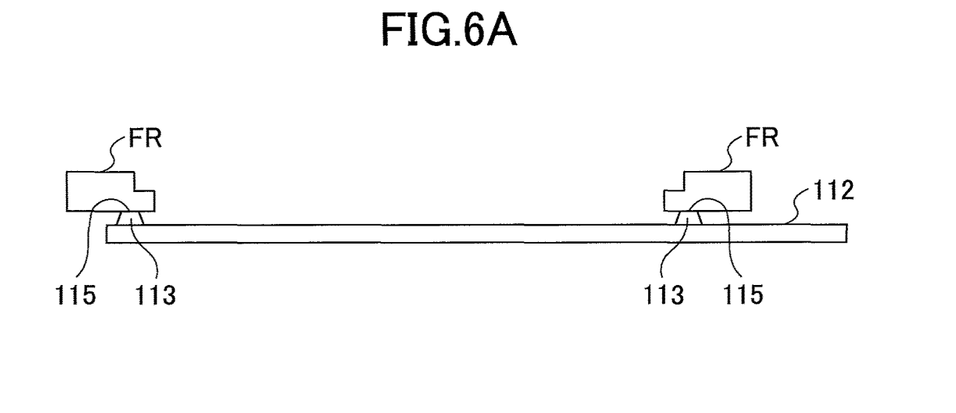
FIGS. 6A and 6B are drawings illustrating a pick of a process-unit-side transfer device holding a focus ring.
Figure 6B:
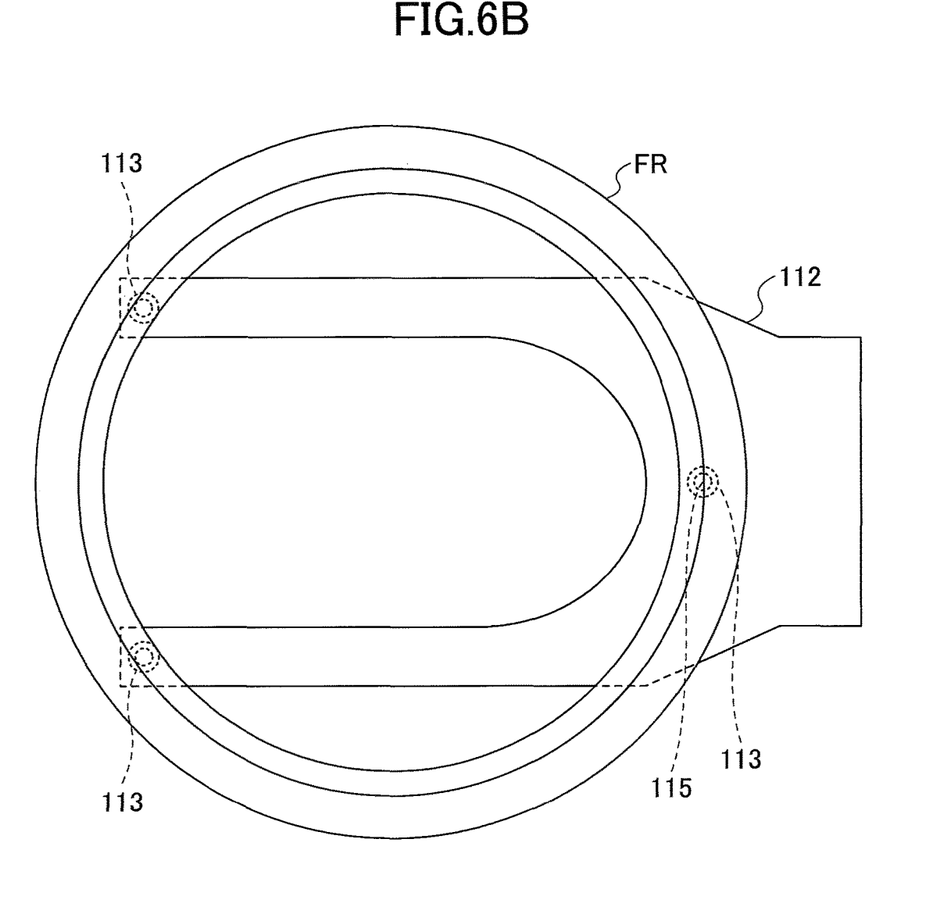

Next, an example of the pick 112 of the process-unit-side transfer device TR1 is described. FIGS. 5A and 5B are drawings illustrating the pick 112 holding the wafer W. FIG. 5A is a side view of the pick 112 holding the wafer W, and FIG. 5B is a top view of the pick 112 holding the wafer W. FIGS. 6A and 6B are drawings illustrating the pick 112 holding the focus ring FR. FIG. 6A is a side view of the pick 112 holding the focus ring FR, and FIG. 6B is a top view of the pick 112 holding the focus ring FR. Although the pick 112 is described below with reference to FIGS. 5A through 6B, the pick 122 may have substantially the same configuration.

As illustrated in FIGS. 5A and 5B, multiple (e.g., three) protrusions 113 for holding the outer edge of the wafer W are formed on the pick 112. The protrusions 113 have, for example, a truncated-cone shape and are arranged to be positioned along the outer edge of the wafer W. A tapered part 114 (or a sloping part) of the truncated-cone shape of each of the protrusions 13 contacts the outer edge of the wafer W to prevent misalignment of the wafer W with the pick 112. The protrusions 113 may be formed of, for example, elastomer.

Also, as illustrated in FIGS. 6A and 6B, an upper surface 115 of the truncated-cone shape of each of the protrusions 113 contacts the lower surface of the focus ring FR to hold the focus ring FR. This is because the inside diameter of the focus ring FR is smaller than the outside diameter of the wafer W. Thus, the pick 112 of the process-unit-side transfer device TR1 can hold the wafer W and the focus ring FR.

As described above, the pick 112 holds the wafer W with the tapered parts 114 of the protrusions 113, and hold the focus ring FR with the upper surfaces 115 of the protrusions 113. This configuration makes it possible to hold the focus ring FR with the pick 112 without increasing the length of the pick 112. This in turn makes it possible to prevent the tip of the pick 112 from contacting other parts (e.g., the inner wall of the FOUP) when transferring the wafer W and the focus ring FR. In the example of FIGS. 5A through 6B, the number of the protrusions 113 is three. However, the number of the protrusions 113 is not limited to three.

The process-unit-side transfer device TR1 is preferably configured to rotate with the minimum radius of rotation when holding the focus ring FR. This configuration makes it possible to prevent the focus ring FR held on the pick 112 from contacting other parts. Also, even in a case where the wafer W is held on the pick 112, the focus ring FR is held on the pick 122, and the picks 112 and 122 rotate on substantially the same plane, this configuration makes it possible to prevent the wafer W and the focus ring FR from contacting each other.

<Position Detection Sensors>

Figure 7:
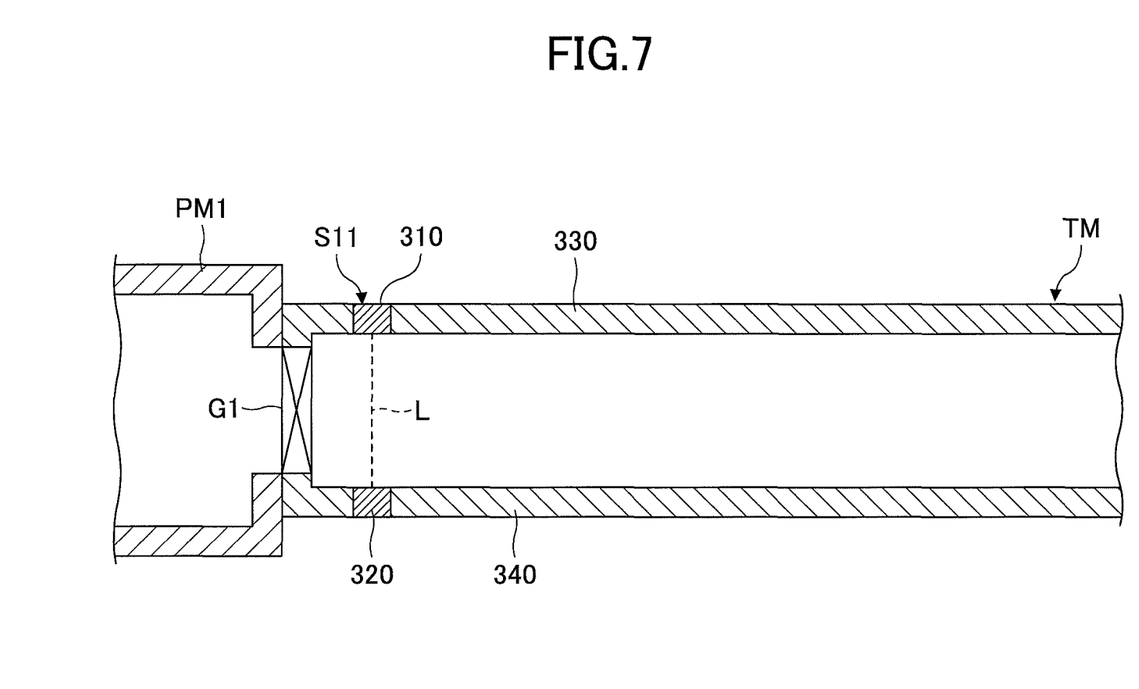
FIG. 7 is a drawing illustrating position detection sensors.

Next, examples of position detection sensors are described with reference to FIG. 7. FIG. 7 is a cross-sectional view of a part of the plasma processing system taken along a dashed-dotted line 1A-1B of FIG. 1.

As illustrated in FIG. 7, the position detection sensor S11 includes a light-emitting part 310 and a light-receiving part 320. The light-emitting part 310 is provided in an upper wall 330 of the transfer module TM, and the light-receiving part 320 is provided in a lower wall 340 of the transfer module TM. The light-emitting part 310 emits a laser beam L toward the light-receiving part 320. The light-receiving part 320 detects the laser beam L emitted from the light-emitting part 310. Although FIG. 7 illustrates only the light-emitting part 310 and the light-receiving part 320 of the position detection sensor S11 as an example, the position detection sensor S12 also has a similar configuration and includes a light-emitting part and a light-receiving part. The laser beam L emitted from the light-emitting part 310 toward the light-receiving part 320 of the position detection sensor S11 is blocked for a given period of time by the wafer W or the focus ring FR that is transferred from the transfer module TM into the process module PM1. Similarly, the laser beam L emitted from the light-emitting part toward the light-receiving part of the position detection sensor S12 is blocked for a given period of time by the wafer W or the focus ring FR that is transferred from the transfer module TM into the process module PM1.

Next, a method for correcting the positions of the wafer W and the focus ring FR is described.

According to an embodiment, the controller CU corrects the position of the wafer W and the position of the focus ring FR using the same position detection sensors.

Figure 8A:
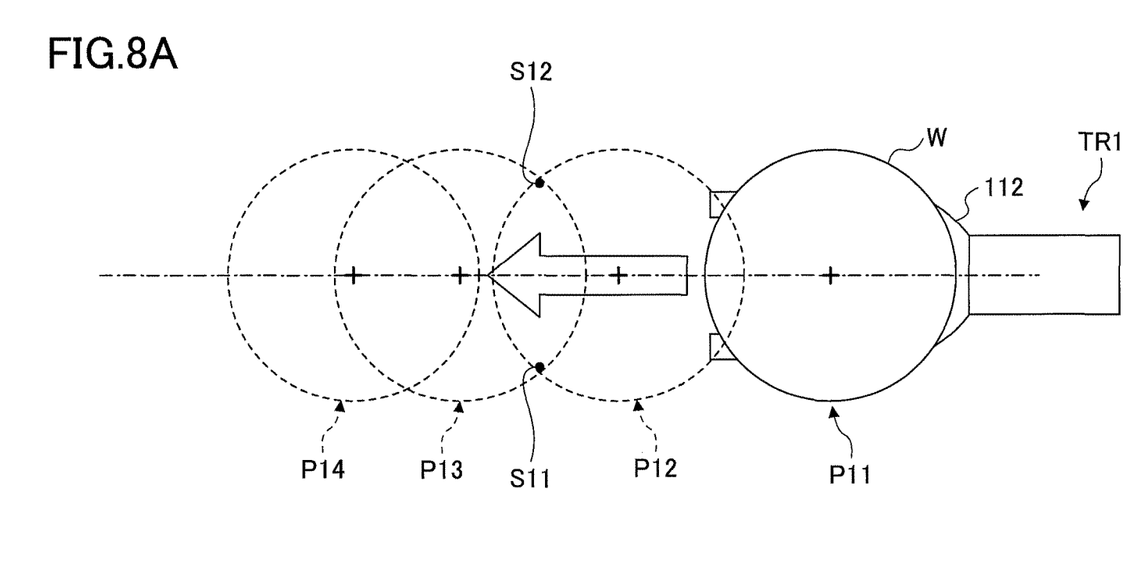
FIGS. 8A and 8B are drawings used to describe a method of correcting the position of a wafer.
Figure 8B:
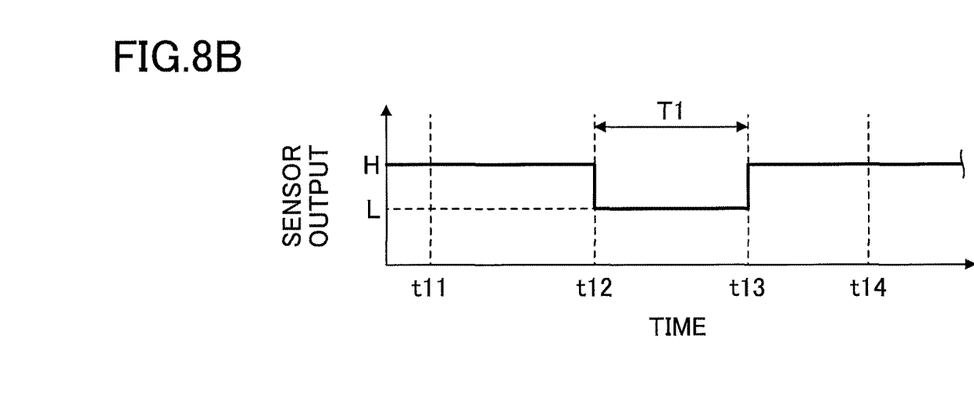

First, a case where the wafer W is transferred from the transfer module TM to the process module PM1 is described with reference to FIGS. 8A and 8B. FIGS. 8A and 8B are drawings used to describe a method of correcting the position of the wafer W. FIG. 8A illustrates a positional relationship between the wafer W and the position detection sensors S11 and S12. FIG. 8B is a graph illustrating changes in the sensor outputs of the position detection sensors S11 and S12 while the wafer W is transferred from a position P11 to a position P14 in FIG. 8A. In FIG. 8B, t11 indicates a time at the position P11, t12 indicates a time at a position P12, t13 indicates a time at a position P13, and t14 indicates a time at the position P14.

The controller CU calculates the amount of misalignment of the wafer W on the pick 112 from a predetermined reference position based on the position of the wafer W detected by the position detection sensors S11 and S12. Next, the controller CU controls the process-unit-side transfer device TR1 to place the wafer W on the mount table 3 of the process module PM1 such that the calculated amount of misalignment is corrected. This method makes it possible to place the wafer W in a predetermined position on the mount table 3 of the process module PM1 even when the position of the wafer W on the pick 112 is misaligned with the reference position.

The position of the wafer W on the pick 112 can be calculated based on changes in the sensor outputs of the position detection sensors S11 and S12 that are caused when the outer edge of the wafer W passes the position detection sensors S11 and S12. For example, when the wafer W is transferred from the position P11 to the position P14 as illustrated in FIG. 8A, the position of the wafer W on the pick 112 can be calculated based on a time period T1 between the time t12 and the time t13 corresponding to the position P12 and the position P13 where the emitted light of the position detection sensors S11 and S12 is blocked by the wafer W. In the example of FIG. 8B, the time period T1 can be calculated by T1=t13−t12 based on the time t12 at the position P12 and the time t13 at the position P13. In FIGS. 8A and 8B, it is assumed that the emitted light of the position detection sensor S11 and the emitted light of the position detection sensor S12 are blocked at the same position. However, the emitted light of the position detection sensor S11 and the emitted light of the position detection sensor S12 may be blocked at different positions.

The reference position may be calculated based on, for example, the encoder positions of the rotation motor and the extension motor for driving the first arm 111 of the process-unit-side transfer device TR1. The reference position may also be calculated according to any other appropriate method.

Figure 9A:
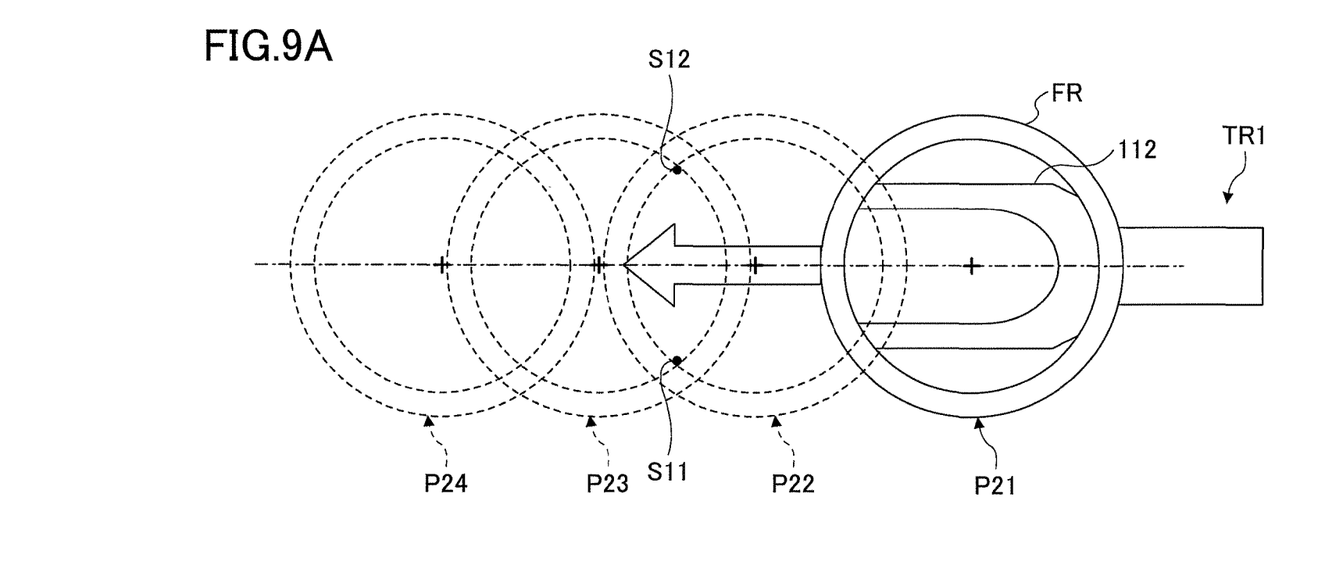
FIGS. 9A and 9B are drawings used to describe a method of correcting the position of a focus ring.
Figure 9B:
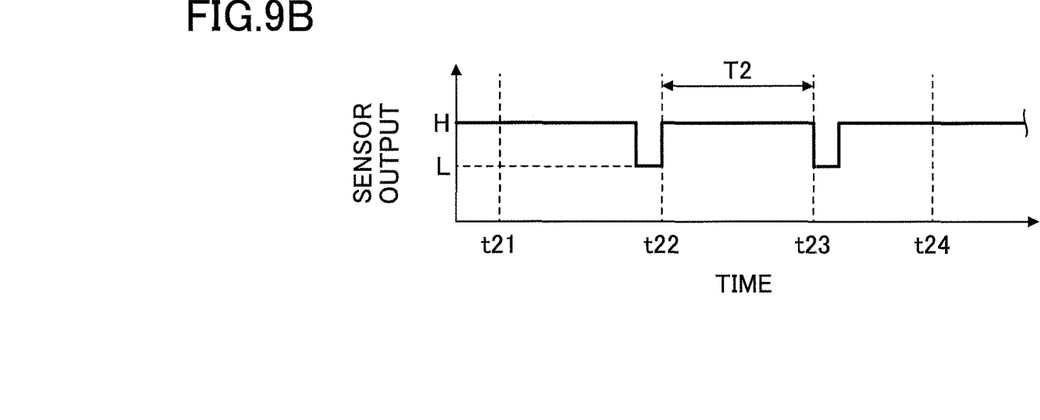

Next, a case where the focus ring FR is transferred from the transfer module TM to the process module PM1 is described with reference to FIGS. 9A and 9B. FIGS. 9A and 9B are drawings illustrating a method of correcting the position of the focus ring FR. FIG. 9A illustrates a positional relationship between the focus ring FR and the position detection sensors S11 and S12. FIG. 9B is a graph illustrating changes in the sensor outputs of the position detection sensors S11 and S12 while the focus ring FR is transferred from a position P21 to a position P24 in FIG. 9A. In FIG. 9B, t21 indicates a time at the position P21, t22 indicates a time at a position P22, t23 indicates a time at a position P23, and t24 indicates a time at the position P24.

The controller CU calculates the amount of misalignment of the focus ring FR on the pick 112 from a predetermined reference position based on the position of the focus ring FR detected by the position detection sensors S11 and S12. Next, the controller CU controls the process-unit-side transfer device TR1 to place the focus ring FR on the mount table 3 of the process module PM1 such that the calculated amount of misalignment is corrected. This method makes it possible to place the focus ring FR in a predetermined position on the mount table 3 of the process module PM1 even when the position of the focus ring FR on the pick 112 is misaligned with the reference position.

The position of the focus ring FR on the pick 112 can be calculated based on changes in the sensor outputs of the position detection sensors S11 and S12 that are caused when the inner edge of the focus ring FR passes the position detection sensors S11 and S12. For example, when the focus ring FR is transferred from the position P21 to the position P24 as illustrated in FIG. 9A, the position of the focus ring FR on the pick 112 can be calculated based on a time period T2 between the time t22 and the time t23 taken to transfer the focus ring FR from the position P22 to the position P23. At the position P22, the sensor outputs of the position detection sensors S11 and S12 change from a low (L) level to a high (H) level. At the position P23, the sensor outputs of the position detection sensors S11 and S12 change from the high (H) level to the low (L) level. In the example of FIG. 9B, the time period T2 can be calculated by T2=t23−t22 based on the time t22 at the position P22 and the time t23 at the position P23. In FIGS. 9A and 9B, it is assumed that the emitted light of the position detection sensor S11 and the emitted light of the position detection sensor S12 are blocked at the same position. However, the emitted light of the position detection sensor S11 and the emitted light of the position detection sensor S12 may be blocked at different positions.

Here, when the focus ring FR is damaged or falls off the pick 112 while being transferred, the waveform of FIG. 9B is not detected. In this case, the controller CU determines that an error has occurred during the transfer of the focus ring FR and terminates the transfer process.

The reference position may be calculated based on, for example, the encoder positions of the rotation motor and the extension motor for driving the first arm 111 of the process-unit-side transfer device TR1. The reference position may also be calculated according to any other appropriate method.

A focus ring replacement method and a plasma processing system according to the embodiments of the present invention are described above. However, the present invention is not limited to the specifically disclosed embodiments, and variations and modifications may be made without departing from the scope of the present invention.

Although cleaning processes are performed using plasma at the first cleaning step S30 and the second cleaning step S50 described above, the present invention is not limited to this embodiment. For example, the cleaning processes may be performed by non-plasma particle cleaning (NPPC) where particles are removed from components in a process chamber and discharged from the process chamber using a gas impact, a gas viscous force, and an electromagnetic stress instead of plasma.

An aspect of this disclosure provides a focus ring replacement method and a plasma processing system that can improve productivity.

What is claimed is:

1. A method performed by a processor of a plasma processing system including a transfer device and a plasma processing apparatus that includes a process chamber, the method comprising:
controlling the transfer device to transfer a first focus ring out of the process chamber without opening the process chamber to atmosphere, the process chamber including a mount table on a surface of which the first focus ring is placed;
controlling the plasma processing apparatus to clean the surface of the mount table in a period that is after the first focus ring is transferred out of the process chamber and before a second focus ring is transferred into the process chamber, and during which no focus ring is present in the process chamber; and
controlling the transfer device to transfer the second focus ring into the process chamber and place the second focus ring on the surface of the mount table without opening the process chamber to the atmosphere.

2. The method as claimed in claim 1, further comprising:
controlling the plasma processing apparatus to perform plasma processing to season the process chamber after the second focus ring is transferred into the process chamber.

3. The method as claimed in claim 1, wherein the surface of the mount table is cleaned by non-plasma particle cleaning (NPPC) or by using plasma.

4. The method as claimed in claim 1, wherein the surface of the mount table is cleaned while a substrate is placed on the mount table.

5. The method as claimed in claim 2, further comprising:
after the process chamber is seasoned, controlling the transfer device to place a quality-control wafer in the process chamber and controlling the plasma processing apparatus to perform a predetermined process on the quality-control wafer.

6. The method as claimed in claim 1, further comprising:
processing a substrate with plasma in the process chamber before the first focus ring is transferred out of the process chamber.

7. A method performed by a processor of a plasma processing system including a transfer device and a plasma processing apparatus that includes a process chamber, the method comprising:
controlling the transfer device to transfer a first focus ring out of the process chamber without opening the process chamber to atmosphere, the process chamber including a mount table on a surface of which the first focus ring is placed;
detecting a position of a second focus ring held on the transfer device; and
controlling the transfer device to transfer the second focus ring into the process chamber and place the second focus ring on the surface of the mount table based on the detected position without opening the process chamber to the atmosphere, wherein
each of the first focus ring and the second focus ring includes an inner edge defining a circumference of an opening formed in each of the first focus ring and the second focus ring; and
the position of the second focus ring is detected based on a detection of the inner edge of the second focus ring by at least one sensor.

8. The method as claimed in claim 5, wherein the second focus ring is placed in a predetermined position on the surface of the mount table by compensating for a misalignment between the detected position of the second focus ring and a reference position.

9. The method as claimed in claim 7, further comprising:
determining whether the second focus ring is on the transfer device based on whether the second focus ring is detected by the at least one sensor.

10. The method as claimed in claim 7, wherein a substrate held on the transfer device is detected by the at least one sensor.

11. The method as claimed in claim 7, wherein the at least one sensor is disposed in front of an opening of the process chamber.

12. The method as claimed in claim 7, wherein
the at least one sensor includes a first sensor and a second sensor that are disposed such that a distance between the first sensor and the second sensor is less than an outside diameter of a substrate to be transferred by the transfer device and less than an inside diameter of each of the first focus ring and the second focus ring.

13. The method as claimed in claim 7, wherein
the position of the second focus ring held on the transfer device is detected based on changes in an output of the at least one sensor that are caused when the inner edge of the second focus ring passes the at least one sensor.

14. A method of replacing a first focus ring configured to surround a substrate in a process chamber with a second focus ring, the method comprising:
determining whether the first focus ring needs to be replaced;
determining whether the plasma processing apparatus is in a replaceable state where the first focus ring is replaceable;
transferring the first focus ring out of the process chamber when it is determined that the first focus ring needs to be replaced and the plasma processing apparatus is in the replaceable state;
transferring the second focus ring into the process chamber; and
cleaning the process chamber before or after transferring the first focus ring out of the process chamber, wherein
the transferring of the first focus ring and the transferring of the second focus ring are performed without opening the process chamber to atmosphere;
the plasma processing apparatus is determined to be in the replaceable state when no substrate is being processed in the process chamber; and
when a substrate is being processed in the process chamber, the plasma processing apparatus is determined to be in the replaceable state when processing of all substrates in a same lot as the substrate is completed.

15. The method as claimed in claim 14, wherein whether the first focus ring needs to be replaced is determined based on one or more of a total amount of time for which radio-frequency power is supplied to the plasma processing apparatus to perform plasma processing, a total amount of radio-frequency power supplied to the plasma processing apparatus to perform plasma processing, a total amount of time for which radio-frequency power is supplied to the plasma processing apparatus to perform a specific step, and a total amount of radio-frequency power supplied to the plasma processing apparatus to perform the specific step.

16. The method as claimed in claim 14, wherein the process chamber is cleaned before transferring the first focus ring out of the process chamber.

17. The method as claimed in claim 16, wherein the process chamber is cleaned after processing a substrate with plasma in the process chamber.

18. The method as claimed in claim 17, wherein the process chamber is cleaned after the substrate is transferred out of the process chamber.

19. The method as claimed in claim 14, wherein the cleaning of the process chamber prevents deposits in the process chamber from being stirred up while the first focus ring is transferred out of the process chamber.

* * * * *